(12) United States Patent
Yamanaka

(10) Patent No.: US 8,084,917 B2
(45) Date of Patent: Dec. 27, 2011

(54) SURFACE ACOUSTIC WAVE RESONATOR, SURFACE ACOUSTIC WAVE OSCILLATOR, AND SURFACE ACOUSTIC WAVE MODULE DEVICE

(75) Inventor: Kunihito Yamanaka, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 12/603,225

(22) Filed: Oct. 21, 2009

(65) Prior Publication Data

US 2010/0102669 A1   Apr. 29, 2010

(30) Foreign Application Priority Data

Oct. 24, 2008   (JP) ................... 2008-273971

(51) Int. Cl.
*H03H 9/25* (2006.01)
(52) U.S. Cl. .............. 310/313 B; 310/313 D; 310/360
(58) Field of Classification Search .............. 310/313 B, 310/313 D, 360
See application file for complete search history.

(56) References Cited

U.S. PATENT DOCUMENTS

| | | | |
|---|---|---|---|
| 5,189,330 A * | 2/1993 | Niitsuma ................ | 310/313 B |
| 5,682,126 A * | 10/1997 | Plesski et al. ............. | 333/193 |
| 6,420,946 B1 | 7/2002 | Bauer et al. | |
| 6,853,270 B2 * | 2/2005 | Shibahara ................ | 333/195 |
| 7,042,132 B2 * | 5/2006 | Bauer et al. ............ | 310/313 D |
| RE39,538 E | 4/2007 | Bauer et al. | |
| 2004/0251989 A1 | 12/2004 | Takagi et al. | |
| 2005/0035831 A1 | 2/2005 | Kawachi et al. | |

FOREIGN PATENT DOCUMENTS

| | | |
|---|---|---|
| JP | A-61-220515 | 9/1986 |
| JP | A-63-135010 | 6/1988 |
| JP | A-03-139008 | 6/1991 |
| JP | A-10-335966 | 12/1998 |
| JP | B2-3310132 | 7/2002 |
| JP | A-2003-258595 | 9/2003 |
| JP | A-2004-194275 | 7/2004 |
| JP | A-2004-363641 | 12/2004 |
| JP | A-2005-204042 | 7/2005 |
| JP | B2-4017984 | 12/2007 |

* cited by examiner

*Primary Examiner* — Thomas M Dougherty
(74) *Attorney, Agent, or Firm* — Oliff & Berridge, PLC

(57) ABSTRACT

A surface acoustic wave resonator includes a piezoelectric substrate and an interdigital transducer (IDT) that includes electrode fingers exciting a surface acoustic wave on the piezoelectric substrate, a first region at a center of the IDT, and a second region and a third region at opposite sides of the IDT. In the IDT, a line occupation rate at which an electromechanical coupling coefficient becomes a maximum is different from the line occupation rate at which reflection of the surface acoustic wave becomes a maximum.

7 Claims, 7 Drawing Sheets

SURFACE ACOUSTIC WAVE RESONATOR, SURFACE ACOUSTIC WAVE OSCILLATOR, AND SURFACE ACOUSTIC WAVE MODULE DEVICE

BACKGROUND

1. Technical Field

The present invention relates to a surface acoustic wave resonator using a piezoelectric substrate, a surface acoustic wave oscillator, and a surface acoustic wave module device.

2. Related Art

Surface acoustic wave resonators using a surface acoustic wave (SAW) have been widely used as electronic apparatuses. In recent years, along with the popularization of portable apparatuses, it is required to downsize the surface acoustic wave resonators, which are used for the portable apparatuses. If the number of pairs of interdigital transducer (ITD) is reduced for downsizing the surface acoustic wave resonator, a decrease in a Q value or an increase in a crystal impedance (CI) value is caused. Thereby, characteristics of the surface acoustic wave resonator cannot be substantially obtained. The decrease in the Q value blocks excitation of a stable surface acoustic wave while the increase in the CI value causes an increase in power consumption in an oscillation circuit. As a countermeasure against these, for example, a technique for downsizing a surface acoustic wave resonator is disclosed in JP-A-2004-194275. The surface acoustic wave resonator can be downsized by dividing the IDT into three regions and electrode fingers in each region of the IDT are formed at a fixed pitch which differs within 2%. As a result, the Q value is increased and the CI value is decreased, allowing the surface acoustic wave resonator to be downsized.

However, as characteristics of a surface acoustic wave resonator, the larger the Q value, the more excitation of a surface acoustic wave is stabilized. In addition, the smaller the CI value, the lower power consumption can be achieved. Thus, a surface acoustic wave is required that is downsized and whose characteristics are enhanced.

SUMMARY

The invention is proposed in order to solve the above-mentioned problems and can be achieved by the following aspects.

According to a first aspect of the invention, a surface acoustic wave resonator includes a piezoelectric substrate and an interdigital transducer (IDT) that includes electrode fingers exciting a surface acoustic wave on the piezoelectric substrate, a first region at a center of the IDT, and a second region and a third region at opposite sides of the IDT. In the IDT, a line occupation rate at which an electromechanical coupling coefficient becomes a maximum is different from the line occupation rate at which reflection of the surface acoustic wave becomes a maximum. Each of the first, second, and third regions has a uniform electrode finger interval, and the electrode finger intervals in the second and third regions are larger than the electrode finger interval of the first region. The first region has a first line occupation rate, the second region has a second line occupation rate, and the third regions has a third line occupation rate, and the first, second and third line occupation rates are uniform in the first, second, and third regions respectively, and an electromechanical coupling coefficient at the first line occupation rate is larger than the electromechanical coupling coefficients at the second line occupation rate and the third line occupation rate, and the reflection of the surface acoustic wave at the second line occupation rate and the third line occupation rate is larger than the reflection of the surface acoustic wave at the first line occupation rate. The line occupation rate is defined as a value obtained by dividing a width of the electrode finger by an electrode finger interval that is an interval between centers of the adjacent electrode fingers.

According to the structure, the IDT, in which the line occupation rate at which the electromechanical coupling coefficient becomes the maximum is different from the line occupation rate at which the reflection of a surface acoustic wave becomes the maximum, is divided into three regions, and the three regions are weighted by the electrode finger interval and the line occupation rate. Each of the first, second, and third regions of the IDT has a uniform electrode finger interval, and the electro finger intervals in the second and third regions are formed larger than that in the first region. The first region has a first line occupation rate, the second region has a second line occupation rate, and the third regions has a third line occupation rate, and the first, second and third line occupation rates are uniform in the first, second, and third regions respectively, and an electromechanical coupling coefficient at the first line occupation rate is larger than the electromechanical coupling coefficients at the second line occupation rate and the third line occupation rate, and the reflection of the surface acoustic wave at the second line occupation rate and the third line occupation rate is larger than the reflection of the surface acoustic wave at the first line occupation rate. A standing wave of a surface acoustic wave generated in the surface acoustic wave resonator has large oscillation displacement in the first region, which is the center of the IDT. On the other hand, the standing wave has small oscillation displacement in the second and third regions, which are opposite sides of the IDT. In the first region having large oscillation displacement, a line occupation rate is selected at which the electromechanical coupling coefficient becomes large in order to suppress an increase in a CI value. On the other hand, in the second and third regions having small oscillation displacement, a line occupation rate is selected at which reflection of a surface acoustic wave becomes large in order to enhance the oscillation energy confinement effect. Accordingly, the surface acoustic wave resonator having excellent CI value and Q value can be realized. As a result, the surface acoustic wave resonator can be downsized while the Q value is improved, and the surface acoustic wave resonator having low power consumption can be provided by decreasing the CI value.

In the surface acoustic wave resonator, a ratio of an electrode finger interval PTc in the first region to an electrode finger interval PTs2 in the second region is in a range of 1.006 or more to 1.014 or less, and a ratio of the electrode finger interval PTc in the first region to an electrode finger interval PTs3 in the third region preferably is in a range of 1.006 or more to 1.014 or less.

According to the structure, the surface acoustic wave resonator can be provided whose Q value exceeds that of the related art surface acoustic wave resonator of which the IDT is divided into three regions and electrode fingers in each region of the IDT are formed at a fixed pitch which differs within 2%.

In the surface acoustic wave resonator, the first line occupation rate preferably is a rate at which the electromechanical coupling coefficient becomes the maximum, and the second line occupation rate and the third line occupation rate are rates at which the reflection of the surface acoustic wave becomes the maximum.

According to the structure, the surface acoustic resonator can be provided whose Q value exceeds that of the related art surface acoustic wave resonator.

In the surface acoustic wave resonator, the piezoelectric substrate preferably is a quartz substrate having an Euler angle of (−1° to +1°, 113° to 135°, ±(40° to 49°)). In the resonator, a value of the first line occupation rate preferably is in a range of 0.35 or more to 0.5 or less, and values of the second line occupation rate and the third line occupation rate preferably are less than 0.35.

According to the structure, the surface acoustic resonator can be provided that exhibits excellent frequency temperature characteristics and whose Q value is increased and whose CI value is reduced by using an in-plane rotated ST cut quartz substrate having the Euler angle of (−1° to +1°, 113° to 135°, ±(40° to 49°), setting a value of the first line occupation rate in a range of 0.35 or more to 0.5 or less, and setting values of the second line occupation rate and the third line occupation rate less than 0.35.

In the surface acoustic wave resonator, the piezoelectric substrate preferably is a quartz substrate having the Euler angle of (−1° to +1°, 121° to 132°, −3° to +3°)). In the resonator, a value of the first line occupation rate preferably is in a range of 0.4 or more to 0.6 or less, and values of the second line occupation rate and the third line occupation rate preferably are more than 0.6.

According to the structure, the surface acoustic resonator can be provided that exhibits excellent frequency temperature characteristics and whose Q value is increased and whose CI value is reduced by using an in-plane rotated ST cut quartz substrate having the Euler angle of (−1° to +1°, 113° to 135°, ±(40° to 49°)), setting a value of the first line occupation rate in a range of 0.4 or more to 0.6 or less, and setting values of the second line occupation rate and the third line occupation rate more than 0.6.

According to a second aspect of the invention, a surface acoustic wave oscillator includes the surface acoustic wave resonator according to the first aspect and a circuit element. In the oscillator, the surface acoustic wave resonator and the circuit element are mounted in a package.

According to the structure, since the surface acoustic wave resonator whose Q value is increased and whose CI value is decreased is mounted, an oscillation of a surface acoustic wave is stable. As a result, the surface acoustic wave oscillator having low power consumption can be provided.

According to a third aspect of the invention, a surface acoustic wave module device includes the surface acoustic wave resonator of the first aspect mounted on a circuit substrate.

According to the structure, since the surface acoustic wave resonator whose Q value is increased and whose CI value is decreased is mounted, an oscillation of a surface acoustic wave is stable. As a result, the surface acoustic wave oscillator having low power consumption can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

Comparative Example

Figure 13:
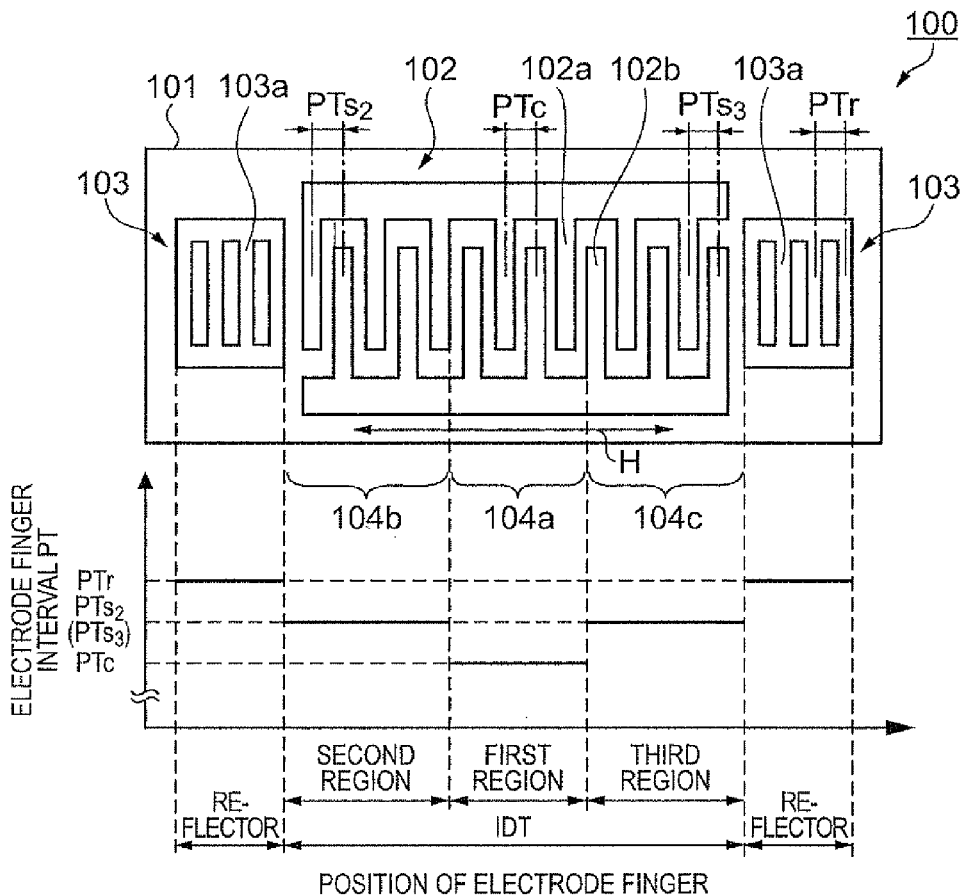
FIG. 13 is a diagram illustrating a surface acoustic wave resonator of a related art.

First, a surface acoustic wave resonator of a related art will be described for comparison with the embodiments of the invention. FIG. 13 is a diagram illustrating a surface acoustic wave resonator based on JP-A-2004-194275. A surface acoustic wave resonator 100 includes an interdigital transducer (IDT) 102 composed of interdigital electrodes and a pair of reflectors 103 formed in a manner sandwiching the IDT 102 in a propagation direction of a surface acoustic wave. The IDT 102 and the reflectors 103 are arranged on a quartz substrate 101 serving as a piezoelectric substrate.

The quartz substrate 101 is made of an in-plane rotated ST cut quartz substrate whose cut surface and whose surface acoustic wave propagation direction are (−1° to +1°, 113° to 135°, ±(40° to 49°)) when they are expressed by Euler angle ($\Phi$, $\theta$, $\Psi$). The IDT 102 is formed in a manner that electrode fingers 102a and 102b are alternately arranged so as to have different polarities. Two electrode fingers, one of the electrode fingers 102a and one of the electrode fingers 102b, are referred to as a pair of electrode fingers. Further, the IDT 102 is divided into three regions: a first region 104a at the center of the IDT 102; and second and third regions 104b and 104c at opposite sides thereof. Here, an interval between the centers of the adjacent electrode fingers 102a and 102b is denoted as an electrode finger interval PT. The electrode finger interval PT is constant in each region. However, the electrode finger intervals PT are different in the regions. A relationship of $PTc < PTs_2 = PTs_3$ is satisfied when the electrode finger interval of the first region 104a is denoted as PTc, the electrode finger interval of the second region 104b is denoted as $PTs_2$, and the electrode finger interval of the third region 104c is denoted as $PTs_3$. The reflectors 103 includes a multiple of electrode fingers 103a aligned therein so as to be electrically neutral. In addition, a relationship of $PTc<PTs_2=PTs_3<PTr$ is satisfied when the electrode finger interval, an interval between the centers of the adjacent electrode fingers 103a, is denoted as PTr.

Figure 14:
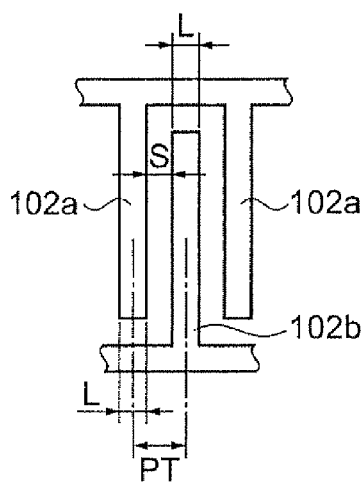
FIG. 14 is a diagram illustrating the line occupation rate.

A surface acoustic wave excited by the IDT 102 propagates along an arrow H, and proceeds to a direction orthogonal to the electrode fingers 102a and 102b. Here, a ratio of the electrode fingers to the IDT 102 and the reflectors 103 in the propagation direction of a surface acoustic wave is denoted as a line occupation rate η. Specifically, as FIG. 14 shows, PT=S+(L/2+L/2) and the line occupation rate η=(L/2+L/2)/PT are satisfied when a width of the electrode fingers 102a and 102b is denoted as L, a dimension of a space between the adjacent electrode fingers (a space where no electrode fingers are formed) is denoted as S, and an interval between the centers of the adjacent electrode fingers is denoted as PT.

The line occupation rate η is set to be constant (η=0.35) in the IDT 102 and the reflectors 103. The IDT 102 and the reflectors 103 are formed of aluminum (Al) and set to have a predetermined film thickness (0.06λ, λ is a wave length of a surface acoustic wave). Further, in the IDT 102, there are 68 pairs of the electrode fingers in the first region 104a, 34 pairs in each of the second region 104b and the third region 104 c, and 57 pairs in each reflector 103 (250 pairs in total). The respective electrode finger intervals are PTc=10.00 μm, PTs=10.07 μm, and PTr=10.10 μm. In the above surface acoustic wave resonator 100, characteristics are realized as follow: a Q value is 20,500 and a CI value is 18Ω.

First Embodiment

Figure 1:
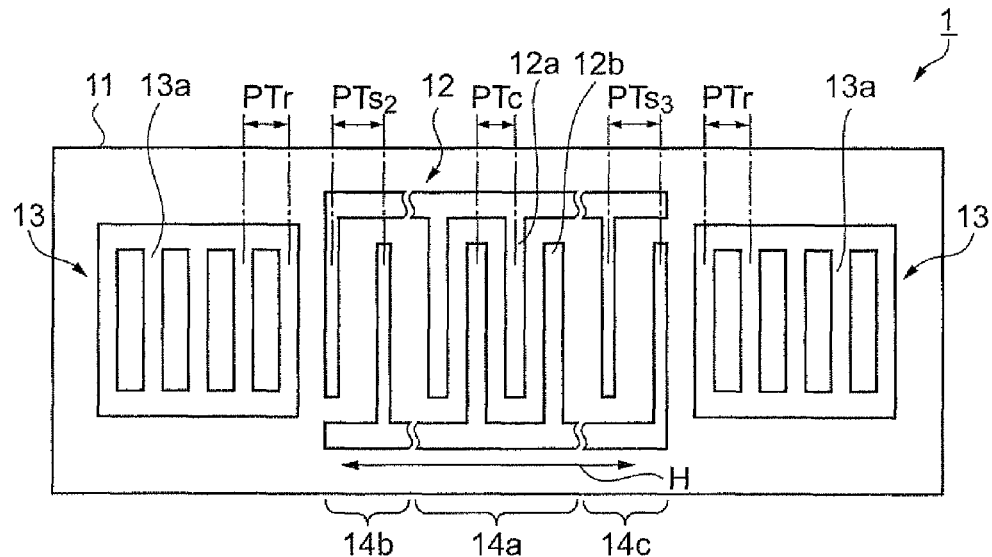
FIG. 1 is a plan view schematically illustrating a structure of a surface acoustic wave resonator of a first embodiment.
Figure 2:
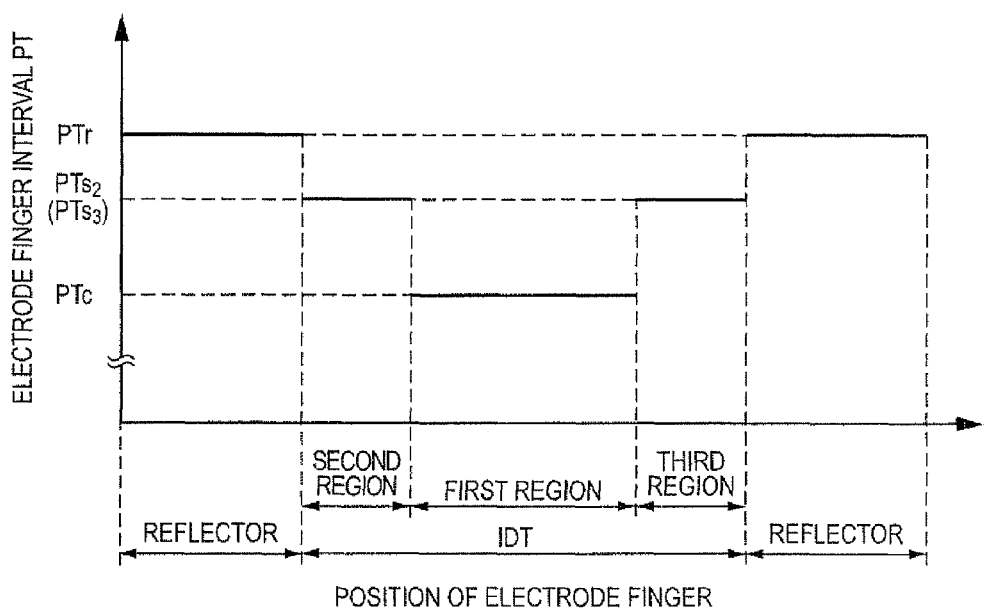
FIG. 2 is a diagram illustrating a relationship between a position of an electrode finger and an electrode finger interval of the first embodiment.
Figure 3:
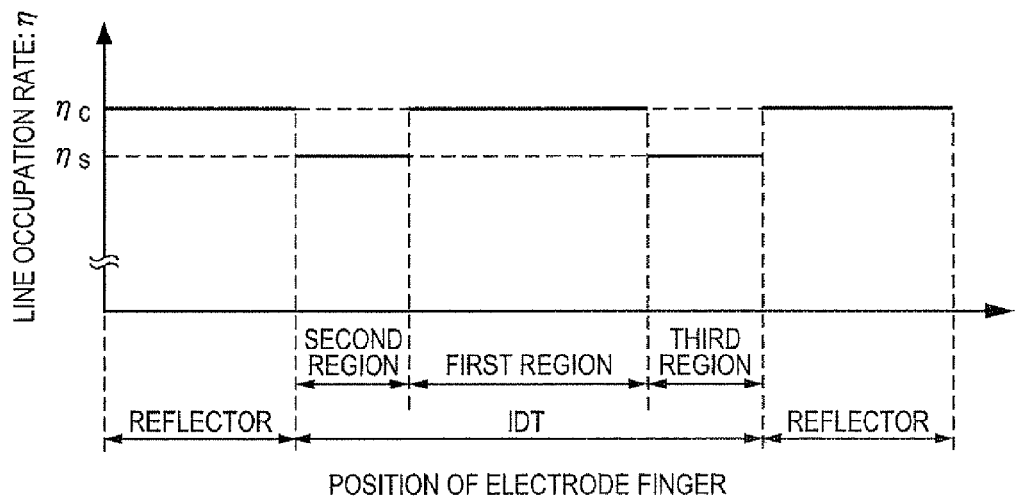
FIG. 3 is a diagram illustrating a relationship between the position of an electrode finger and a line occupation rate of the first embodiment.
Figure 4:
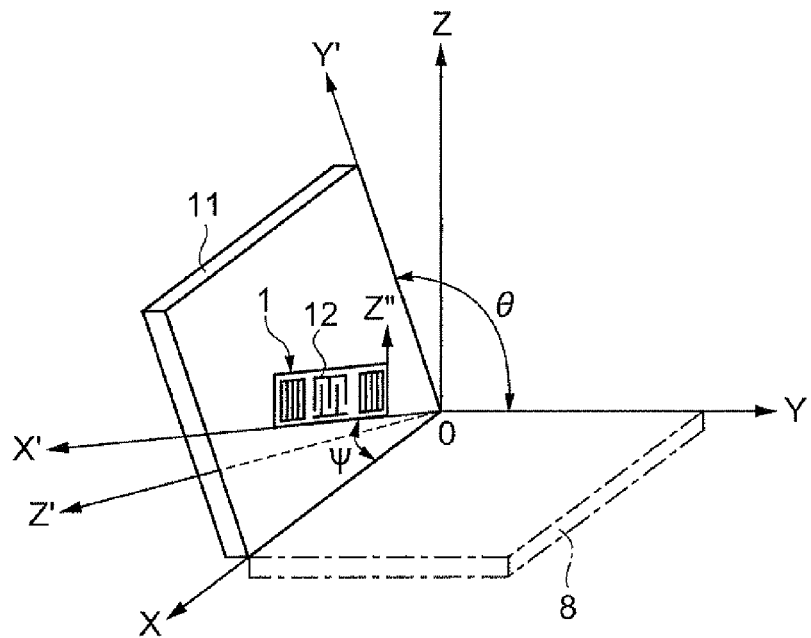
FIG. 4 is a diagram illustrating a cutout angle a quartz substrate and a surface acoustic wave propagation direction thereof.

Next, a first embodiment of the invention will be described. FIG. 1 is a plan view schematically illustrating a structure of the surface acoustic wave resonator of the present embodiment. FIG. 2 is a diagram illustrating a relationship between a position of the electrode finger and the electrode finger interval. FIG. 3 is a diagram illustrating a relationship between the position of the electrode finger and the line occupation rate. FIG. 4 is a diagram illustrating a cutout angle of a quartz substrate and a surface acoustic wave propagation direction thereof.

As FIG. 1 shows, a surface acoustic wave resonator 1 includes an IDT 12 composed of interdigital electrodes and a pair of reflectors 13 formed in a manner sandwiching the IDT 12 in the propagation direction of a surface acoustic wave. The IDT 12 and the reflectors 13 are arranged on a quartz substrate 11 serving as a piezoelectric substrate. In the surface acoustic wave resonator 1, a surface acoustic wave excited by the IDT 12 propagates along the arrow H, and proceeds to a direction orthogonal to electrode fingers 12a and 12b.

The quartz substrate 11 is made of an in-plane rotated ST cut quartz substrate whose cut surface and whose surface acoustic wave propagation direction are (−1° to +1°, 113° to 135°, ±(40° to 49°)) when they are expressed by the Euler angle (ϕ, θ, Ψ). As FIG. 4 shows, crystal axes of quartz crystal is defined by an X axis (electrical axis), a Y axis (mechanical axis), and a Z axis (optical axis). The Euler angle (0°, 0°, 0°) of a quartz Z-plate 8 is perpendicular to the Z axis. Here, ϕ of the Euler angle (now shown) relates to the first rotation of the quartz Z-plate 8, and represents a first rotation angle when the Z axis is a rotation axis and a direction to rotate from +X axis to +Y axis is a positive rotation angle. Further, θ of the Euler angle relates to the second rotation performed after the first rotation of the quartz Z-plate 8, and represents a second rotation angle when the X axis after the first rotation is the rotation axis and a direction to rotate from +Y axis after the first rotation to +Z axis is a positive rotation angle. A cut surface of the quartz substrate 11 is determined based on the first rotation angle ϕ and the second rotation angle θ. Furthermore, Ψ of the Euler angle relates to the third rotation performed after the second rotation of the quartz Z-plate 8, and represents a third rotation angle when the Z axis after the second rotation is the rotation axis and a direction to rotate from +X axis after the second rotation to +Y axis after the second rotation is a positive rotation angle. The propagation direction of a surface acoustic wave is represented by the third rotation angle w with respect to the X axis after the second rotation. For the surface acoustic wave resonator 1, the quartz substrate 11 is used whose first rotation angle ϕ is −1° to +1° and whose second rotation angle θ is 113° to 135°. Additionally, the IDT 12 is arranged such that the propagation direction of a surface acoustic wave is within a range of Ψ=±(40° to 49°). The angle Ψ is also referred to as an in-plane rotated angle. The in-plane rotated ST-cut quartz substrate has a small frequency variation due to a change in temperature, exhibiting excellent frequency temperature characteristics.

The IDT 12 is formed in a manner that the electrode fingers 12a and 12b are alternately arranged so as to have different polarities. In the present embodiment, two electrode fingers, one of the electrode fingers 12a and one of the electrode fingers 12b, are counted as a pair of electrode fingers. The IDT 12 is divided into three regions: a first region 14a at the center of the IDT 12; and second and third regions 14b and 14c at opposite sides thereof. Here, an interval between the centers of the adjacent electrode fingers 12a and 12b is denoted as the electrode finger interval PT. As FIG. 2 shows, the electrode finger interval PT is constant in each region. However, the electrode finger intervals PT are different in the regions. A relationship of $PTc<PTs_2=PTs_3$ is satisfied when the electrode finger interval of the first region 14a is denoted as PTc, the electrode finger interval of the second region 14b is denoted as $PTs_2$, and the electrode finger interval of the third region 14c is denoted as $PTs_3$. Values of $PTs_2$ and $PTs_3$ may be different from each other as long as $PTs_2$ and $PTs_3$ are smaller than a value of PTc.

The reflectors 13 includes a multiple of electrode fingers 13a aligned therein so as to be electrically neutral. The reflectors 13 may be grounded or coupled to either one of the electrode fingers 12a and 12b. In addition, a relationship of $PTc<PTs_2=PTs_3<PTr$ is satisfied when the electrode finger interval, an interval between the centers of the adjacent electrode fingers 13a, is denoted as PTr. In the reflector 13, two adjacent electrode fingers 13a are counted as a pair of electrode fingers.

A relationship between the line occupation rate and the position of the electrode finger will be described. As FIG. 3 shows, the line occupation rate is constant in each region of the first region 14a, the second region 14b, and the third region 14c of the IDT. However, the line occupation rates η are different in the regions. A relationship of ηc>ηs is satisfied when the line occupation rate of the first region 14a is denoted as ηc and the line occupation rates of the second and third regions 14b and 14c are denoted as ηs. Further, the line occupation rate is set to be ηc=ηr when the line occupation rate of the refractors 13 is denoted as ηr.

The IDT 12 and the reflectors 13 are formed of aluminum (Al) and set to have a predetermined film thickness (0.06λ, λ is a wave length of a surface acoustic wave). Further, in the IDT 12, there are 68 pairs of the electrode fingers in the first region 14a, 34 pairs in each of the second region 14b and the third region 14c, and 57 pairs in each reflector 103 (250 pairs in total). The respective electrode finger intervals are PTc=10.00 μm, PTs=10.10 μm, and PTr=10.10 μm. The respective line occupation rates are ηc=0.35, ηs=0.28, and ηr=0.35. In the above surface acoustic wave resonator 1, characteristics are obtained as follows: the Q value is 22,700 and the CI value is 16Ω. As a result, compare with the above-described surface acoustic wave resonator 100, the surface acoustic wave resonator 1 can be obtained whose Q value and CI value are improved.

Figure 5:
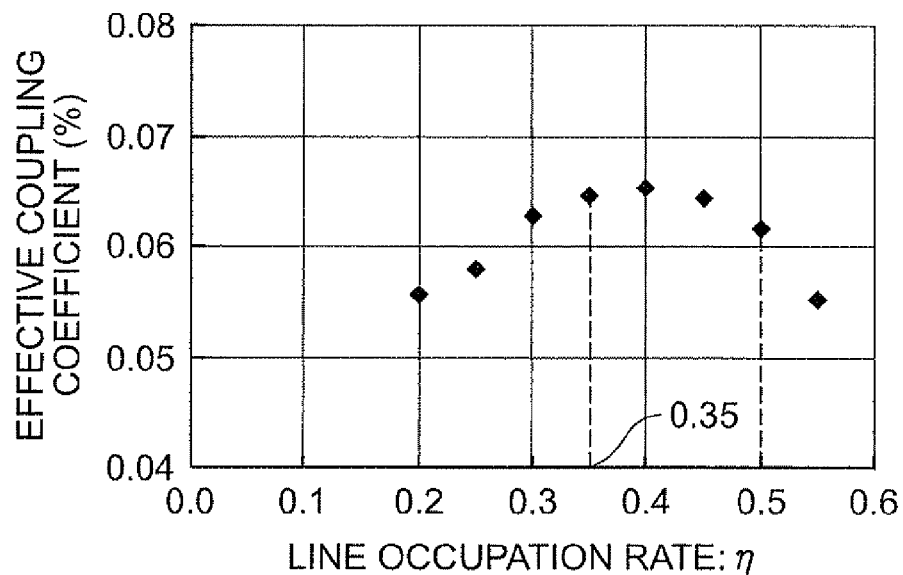
FIG. 5 is a graph illustrating a relationship between the line occupation rate and an effective coupling coefficient of an IDT of the first embodiment.

The structure of the IDT 12 will be described in detail from a design point of view. FIG. 5 is a graph illustrating a relationship between the line occupation rate of the IDT and an effective coupling coefficient. In the surface acoustic wave resonator, the CI value or an equivalent resistance R1 is important characteristics as well as the Q value. By decreasing the CI value or the equivalent resistance R1, the power consumption of the surface acoustic wave resonator can be suppressed. In order to decrease the CI value or the equivalent resistance R1, it is necessary to increase an electromechanical coupling coefficient $K^2$. The electromechanical coupling coefficient $K^2$ can be obtained by the following equation.

$$K^2=(2(Vo-Vs)/Vo)\times100[\%]$$

Here, Vo is a propagation velocity of a surface acoustic wave when each electrode finger of the IDT is in an electrically open state while Vs is the propagation velocity of a surface acoustic wave when each electrode finger of the IDT is in an electrically short-circuit state. The electromechanical coupling coefficient when the line occupation rate η is varied is obtained by a difference between the normalized velocities of the opened state and the short-circuit state of the IDT, and indicated as an effective coupling coefficient in FIG. 5.

As FIG. 5 shows, as the line occupation rate η becomes larger than 0.2, the effective coupling coefficient increases. When the line occupation rate η is approximately 0.4, the effective coupling coefficient becomes the maximum. The effective coupling coefficient at this time is approximately 0.065%, and the CI value or the equivalent resistance R1 becomes the minimum. Then, the line occupation rate η becomes larger than 0.4, the effective coupling coefficient decreases. In the present embodiment, a value in a range of 0.35 or more to 0.5 or less is selected for the first region of the IDT 12 as a line occupation rate η at which the effective coupling coefficient is large.

Figure 6:
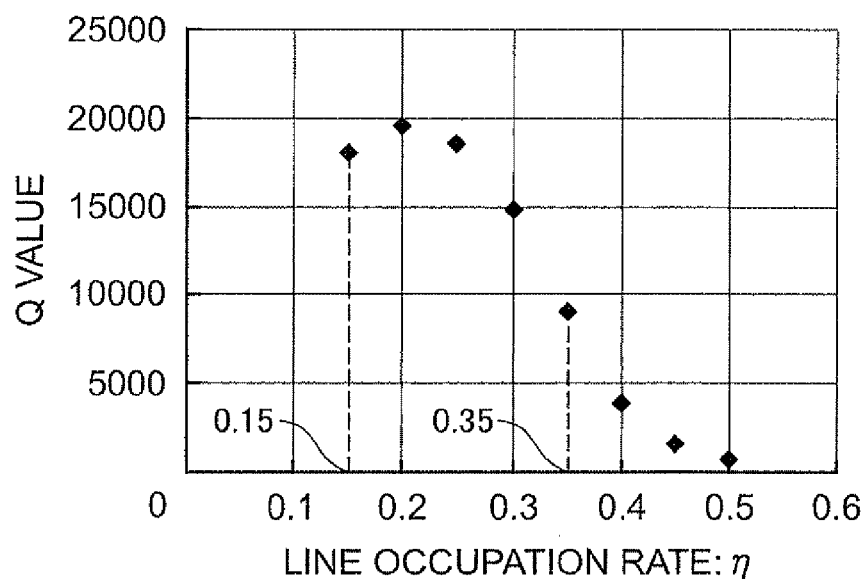
FIG. 6 is a graph illustrating a relationship between the line occupation rate and a Q value of the IDT of the first embodiment.

FIG. 6 is a graph illustrating a relationship between the line occupation rate and the Q value. As the line occupation rate η becomes larger than 0.15, the Q value increases. When the line occupation rate η is approximately 0.2, the Q value becomes the maximum. The Q value at this time is approximately 20,000. Then, as the line occupation rate η becomes larger than 0.2, the Q value decreases. The Q value and reflection amount are correlative. Accordingly, when the Q value is the maximum, the reflection amount is substantially the maximum as well. That is, the reflection of a surface acoustic wave is substantially the maximum when the line occupation rate η is approximately 0.2. At this time, the resonator exhibits excellent oscillation energy confinement, thereby the Q value becomes the maximum. Therefore, in the present embodiment, values less than 0.35 are selected for the second and third regions of the IDT 12 as a line occupation rate η at which reflection is large.

As shown in FIGS. 5 and 6, in the IDT of the present embodiment, the line occupation rate at which the electromechanical coupling coefficient becomes the maximum is different from the line occupation rate at which the Q value and the reflection of a surface acoustic wave becomes the maximum. In the present embodiment, the IDT is divided into three regions, and the three regions are weighted by the electrode finger interval and the line occupation rate. In the first region of the IDT 12, a value in a range of 0.35 or more to 0.5 or less is set as a line occupation rate at which the effective coupling coefficient is large. In the second and third regions, which are the end portions of the IDT 12, values less than 0.35 are set as a line occupation rate so as to have large reflection. A standing wave of a surface acoustic wave generated in the surface acoustic wave resonator 1 has large oscillation displacement in the first region 14a arranged at the center of the IDT 12. On the other hand, the standing wave has small oscillation displacement in the second and third regions 14b and 14c arranged at the opposite sides thereof. In the first region 14a having large oscillation displacement, a line occupation rate is selected at which the electromechanical coupling coefficient is large in order to suppress an increase in the CI value. On the other hand, in the second and third regions 14b and 14c having small oscillation displacement, a line occupation rate is selected at which reflection of a surface acoustic wave is larger in order to enhance the oscillation energy confinement effect. Accordingly, the surface acoustic wave resonator 1 having excellent CI value and Q value can be realized. As a result, the surface acoustic wave resonator 1 can be downsized while the Q value is improved, and the surface acoustic wave resonator 1 having low power consumption can be provided by decreasing the CI value.

Figure 7:
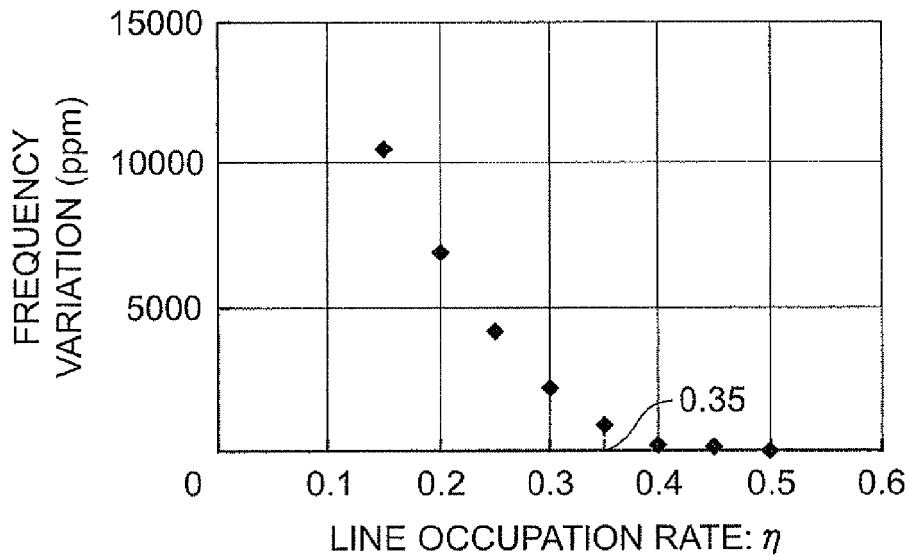
FIG. 7 is a graph illustrating a relationship between the line occupation rate and a frequency variation of the first embodiment.

FIG. 7 is a graph illustrating a relationship between the line occupation rate of the IDT and a frequency variation. As FIG. 7 shows, as the line occupation rate η becomes larger than 0.1, the frequency variation decreases. When the line occupation rate η is approximately 0.4, the frequency variation becomes the minimum.

The first region 14a of the IDT 12 having large oscillation displacement has higher sensitivity of frequency variation when the line occupation rate η varies. The frequency greatly varies in accordance with the variation of the line occupation rate η. On the other hand, the second and third regions 14b and 14c have a small frequency variation. Therefore, even if the line occupation rate η varies in these regions, there is only small effect on the frequency of the surface acoustic wave resonator 1. Accordingly, if a range of a line occupation rate η having a small frequency variation is selected for the first region 14a, the frequency variation can be reduced when the line occupation rate η varies. In the present embodiment, a value in a range of 0.35 or more to 0.5 or less is selected as the line occupation rate ηc of the first region 14a. As a result, variations in frequency during manufacture can be reduced, being able to obtain the surface acoustic wave resonator 1 having high frequency accuracy.

Figure 8:
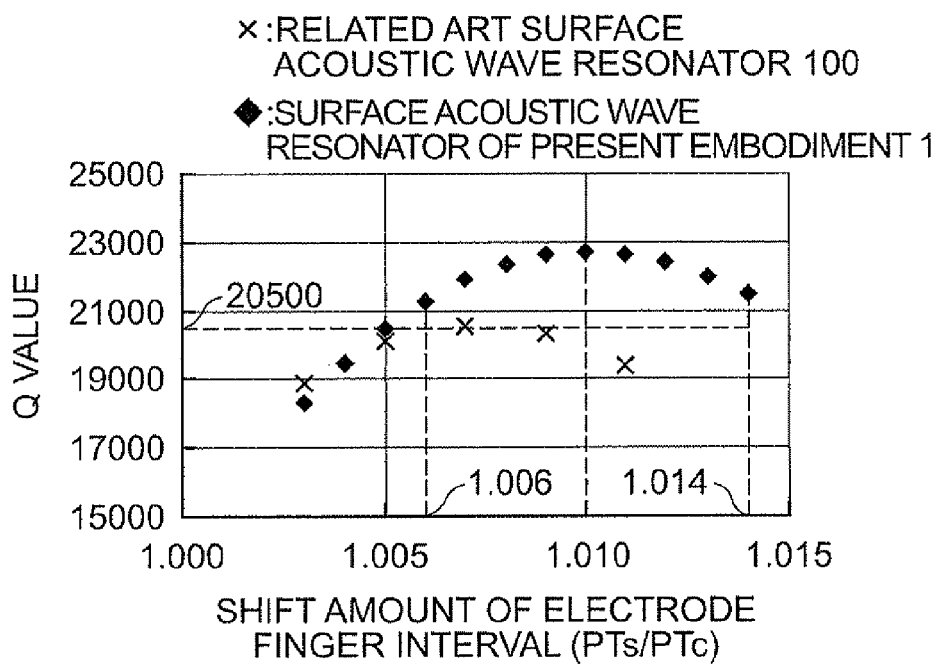
FIG. 8 is a graph illustrating a relationship between a shift amount of the electrode finger interval and the Q value of the first embodiment.

FIG. 8 is a graph illustrating a relationship between a shift amount of the electrode finger interval and the Q value. The shift amount of the electrode finger interval is a ratio of PTs/PTc. Here, PTc is the electrode finger interval of the first region 14a while PTs is the electrode finger interval of the second region 14b or that of the third region 14b. The related art surface acoustic wave resonator 100 obtains the maximum Q value 20,500 when the shift amount of the electrode finger interval is 1.007. The surface acoustic wave resonator 1 of the present embodiment obtains the maximum Q value 22,700 when the shift amount of the electrode finger interval is 1.010, being able to increase the Q value of about 11% comparing with the related art surface acoustic wave resonator 100. By setting the shift amount of the electrode finger interval in a range of 1.006 or more to 1.014 or less, the surface acoustic wave resonator 1 can be obtained whose Q value is increased comparing with the related art surface acoustic wave resonator 100.

Second Embodiment

A surface acoustic wave resonator of a second embodiment will be described. In the present embodiment, the surface acoustic wave propagation direction of the quartz substrate and values of the line occupation rate thereof are different from those in the first embodiment. The quartz substrate is made of an in-plane rotated ST cut quartz substrate whose cut surface and whose surface acoustic wave propagation direction are (−1° to +1°, 113° to 135°, −3° to 3°) when they are expressed by the Euler angle ($\phi$, $\theta$, $\Psi$). In the surface acoustic wave resonator, the IDT is arranged in a manner that the propagation direction of a surface acoustic wave is in the X axis ($\Psi=0°\pm3°$). Further, the electrode fingers intervals in each region of the IDT is the same as those in the first embodiment (refer to FIGS. 1 and 2), and descriptions of the structure of the surface acoustic wave resonator will be omitted.

Figure 9:
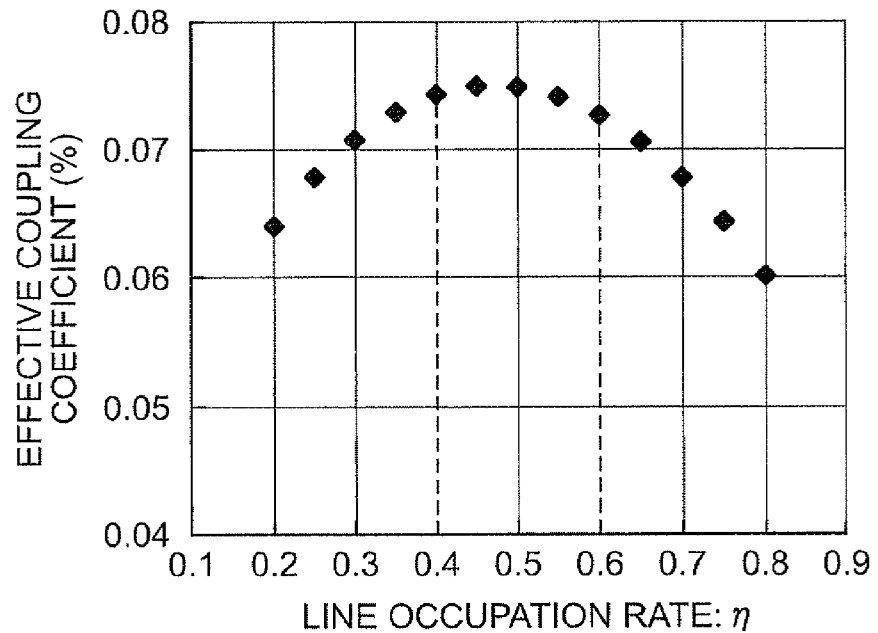
FIG. 9 is a graph illustrating a relationship between the line occupation rate and the effective coupling coefficient of the IDT of a second embodiment.
Figure 10:
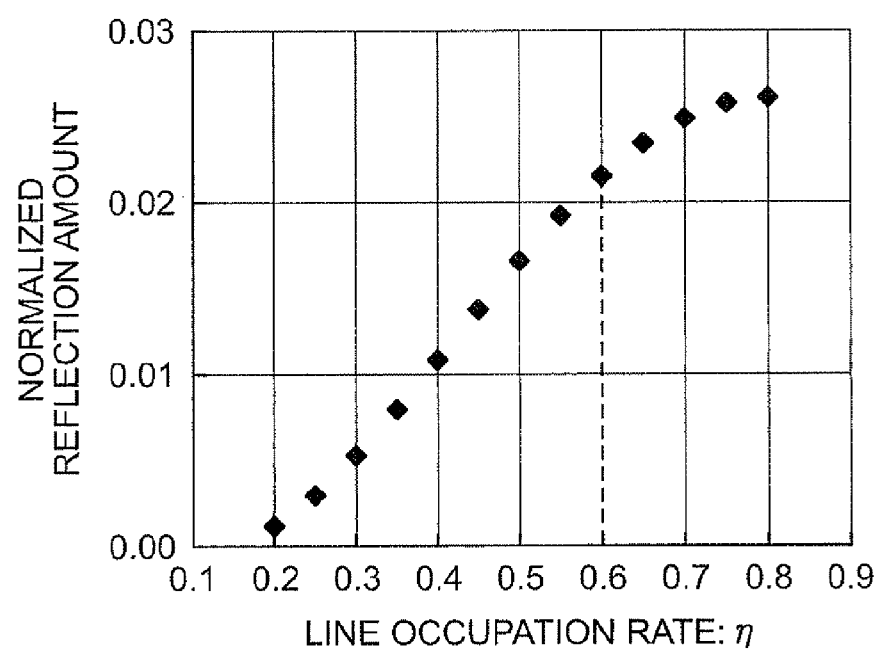
FIG. 10 is a graph illustrating a relationship between the line occupation rate and a normalized reflection amount of the second embodiment.

FIG. 9 is a graph illustrating a relationship between the line occupation rate and effective coupling coefficient of the IDT. FIG. 10 is a graph illustrating a relationship between the line occupation rate and a normalized reflection amount. These graphs illustrate the relationship with the line occupation rate when a quartz substrate of the Euler angle (0°, 123°, 0°) is used as an example of a quartz substrate where a thickness of an aluminum electrode is 0.04$\lambda$. As FIG. 9 shows, as the line occupation rate $\eta$ becomes larger than 0.2, the effective coupling coefficient increases. When the line occupation rate $\eta$ is approximately 0.5, the effective coupling coefficient becomes the maximum. The effective coupling coefficient at this time is approximately 0.075%, and the CI value or the equivalent resistance R1 is the minimum under the same Q value. Then, as the line occupation rate $\eta$ becomes larger than 0.5, the effective coupling coefficient decreases. In the present embodiment, a value in a range of 0.4 or more to 0.6 or less is selected for the first region of the IDT 12 as a line occupation rate at which the effective coupling coefficient is large.

As FIG. 10 shows, as the line occupation rate $\eta$ becomes larger than 0.2, the normalized reflection amount increases. Here, the normalized reflection amount is a reflection amount of a surface acoustic wave obtained by a decreasing rate of frequency generated by reflection. To be specific, the normalized reflection amount is a parameter expressed as [(Fh−F1)/2]/(Vf/$\lambda$) when a resonant frequency at a lower end of a stop band is F1, a resonant frequency at an upper end of the stop band is Fh, a surface acoustic wave propagation velocity at a free surface of the quartz substrate 11 is Vf, and a wavelength of a surface acoustic wave is $\lambda$. The reflection amount becomes substantially the maximum when the line occupation rate $\eta$ is approximately 0.8. At this time, the resonator exhibits excellent oscillation energy confinement, thereby the Q value becomes the maximum. Accordingly, in the present embodiment, values more than 0.6 are selected for the second and third regions of the IDT 12 as a line occupation rate $\eta$ at which the reflection is large. In the IDT 12 of the present embodiment, a line occupation rate of a value in a range of 0.35 or more to 0.5 or less, in which the effective coupling coefficient is large, is selected for the first region while a line occupation rate of a value more than 0.6, in which the reflection is large, is selected for the second and third regions, which are the end portions of the IDT 12.

A standing wave of a surface acoustic wave generated in the surface acoustic wave resonator has large oscillation displacement in the first region, which is the center of the IDT. On the other hand, the standing wave has small oscillation displacement in the second and third regions, which are the opposite sides of the IDT. In the first region having large oscillation displacement, a line occupation rate is selected at which the electromechanical coupling coefficient is large in order to suppress an increase in the CI value. On the other hand, in the second and third regions having small oscillation displacement, a line occupation rate is selected at which the reflection of a surface acoustic wave is large in order to enhance the oscillation energy confinement effect. Accordingly, the surface acoustic wave resonator 1 can be downsized while the Q value is improved, and the surface acoustic wave resonator 1 having low power consumption can be provided by decreasing the CI value.

In the first and second embodiments, aluminum is used for an electrode material of the IDT and the reflectors. However, the same effect is achieved by an aluminum alloy. Except for aluminum, gold (Au), silver (Ag), copper (Cu), tungsten (W), tantalum (Ta) or an alloy mainly containing any of the above may be used as the electrode material. The film thicknesses of the electrode of the IDT in the first and second embodiments are respectively 0.06$\lambda$ and 0.04$\lambda$ ($\lambda$ is a wavelength of a surface acoustic wave). However, it is confirmed that the same effect is obtained with other film thickness. Further, in the first and second embodiments, the line occupation rate $\eta$c of the first region of the IDT and the line occupation rate $\eta$r of the reflectors are set to be equal. However, $\eta$c and $\eta$r are not necessarily set to be equal. For example, the line occupation rate $\eta$r may be set so as to increase reflection at the reflectors. In this case, the line occupation rate $\eta$r may be set to be less than 0.35 in the first embodiment, and that may be set to be more than 0.6 in the second embodiment. The line occupation rate of the reflectors may be set to be equal to that of at least one of the second region and the third region. Alternatively, the first to third regions of the IDT and the reflectors may respectively have different line occupation rates. Further, in the first and second embodiments, the second and third regions have the same electrode finger interval. However, the second and third regions may have different electrode finger intervals from each other. Though the reflectors are arranged at the opposite sides of the IDT in the first and second embodiments, the same effect can be obtained without the reflectors.

Third Embodiment

Figure 11:
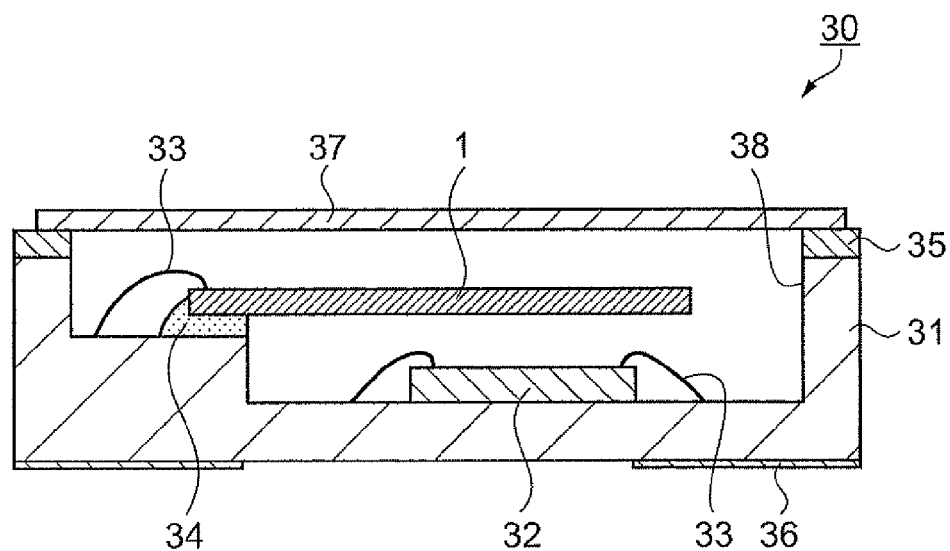
FIG. 11 is a sectional view schematically showing a surface acoustic wave oscillator of a third embodiment.

By mounting the surface acoustic wave resonator of any of the embodiment in a package, a surface acoustic wave oscillator can be configured. FIG. 11 is a sectional view schematically illustrating a surface acoustic wave oscillator including the surface acoustic wave resonator mounted in a package. A surface acoustic wave oscillator 30 includes a ceramic package 31, an IC chip 32, the surface acoustic wave resonator 1, a lid 37, and the like. Formed in the ceramic package 31 is a recess 38 that is opened. Formed in the ceramic package 31 is a seam ring 35 in a manner surrounding the recess 38. The seam ring 35 is formed of a metal material such as kovar, In addition, on the periphery surface of the ceramic package 31, an external connection electrode 36 is formed to make connection with the external such as a circuit substrate. Though it is not illustrated in the drawing, wiring lines are provided so as to couple the external connection electrode 36 to the inside of the recess 38 of the ceramic package 31.

The IC chip 32 is fixed to the bottom surface of the recess 38, and is mounted by a metal wire such as a gold wire. The IC chip 32 is provided with an oscillation circuit exciting the surface acoustic wave resonator 1. The IC chip 32 may include a temperature compensation circuit, a voltage control circuit, and the like. The surface acoustic wave resonator 1 is fixed to a shelf of the recess 38 with an adhesive 34. A pad to be coupled to the IDT and the wiring lines in the ceramic package 31 are coupled by metal wires 33.

On the upper side of the recess 38, the lid 37 made of a metal material, such as kovar, is arranged and air-tightly seals the recess 38 by seam welding the lid 37 and the seam ring 35. Since the surface acoustic wave resonator 1 whose Q value is increased and whose CI value is decreased is mounted in the ceramic package 31, an oscillation of a surface acoustic wave is stable. As a result, the surface acoustic wave oscillator 30 consuming lower power can be obtained.

Fourth Embodiment

Figure 12:
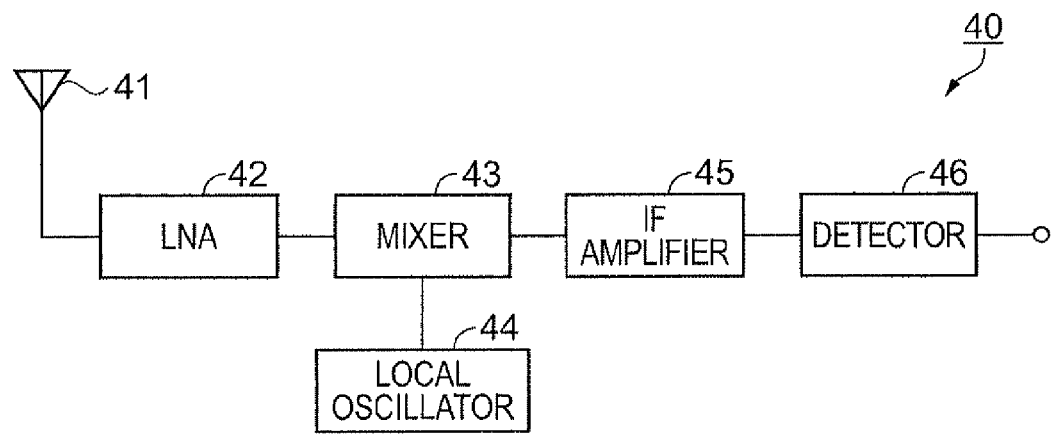
FIG. 12 is a circuit block diagram of a receiver module of a fourth embodiment.

By mounting the surface acoustic wave resonator of any of the embodiments, a surface acoustic wave module device can be configured. FIG. 12 is a circuit block diagram of a receiver module configured by mounting the surface acoustic wave resonator on a circuit substrate as an example of the surface acoustic wave module device.

A receiver module 40 includes a receiving antenna 41, a low-noise amplifier (LNA) 42, a mixer 43, a local oscillator 44, an intermediate frequency (IF) amplifier 45, and a detector 46. The receiving antenna 41 is coupled to an input of the mixer 43 through the LNA 42. The local oscillator 44 is also coupled to the input of the mixer 43. The local oscillator 44 includes the surface acoustic wave resonator and an oscillation circuit exciting the surface acoustic wave resonator. Accordingly, the local oscillator 44 can reliably output frequency signals to the mixer 43. The IF amplifier 45 and the detector 46 are coupled to an output of the mixer 43 in series.

A signal transmitted from a transmitter, which is the other side, is inputted the LNA 42 through the receiving antenna 41. After being amplified in the LNA 42, the signal is inputted to the mixer 43. A frequency signal from the local oscillator 44 is inputted to the mixer 43. The mixer 43 down-converts the signal inputted from the LNA 42 and outputs the signal. The down-converted signal is amplified in the IF amplifier 45 and inputted to the detector 46 so as to be detected. Accordingly, the receiver module 40 can receive signals transmitted from the transmitter. Since the receiver module 40 includes the surface acoustic wave resonator of any of the embodiments in the local oscillator 44, the receiver module 40 can stably receive signals. As a result, the receiver module consuming low power can be obtained. In addition, the above receiver module can be provided to an exterior or the like so as to be functioned as an electronic apparatus.

The entire disclosure of Japanese Patent Application No. 2008-273971, filed Oct. 24, 2008 is expressly incorporated by reference herein.

What is claimed is:
1. A surface acoustic wave resonator, comprising:
a piezoelectric substrate; and
an interdigital transducer (IDT) that includes electrode fingers exciting a surface acoustic wave on the piezoelectric substrate, a first region at a center of the IDT, and a second region and a third region at opposite sides of the IDT, wherein in the IDT, a line occupation rate at which an electromechanical coupling coefficient becomes a maximum is different from the line occupation rate at which reflection of the surface acoustic wave becomes a maximum, wherein each of the first, second, and third regions has a uniform electrode finger interval, and the electrode finger intervals in the second and third regions are larger than the electrode finger interval of the first region, wherein the first region has a first line occupation rate, the second region has a second line occupation rate, and the third regions has a third line occupation rate, and the first, second and third line occupation rates are uniform in the first, second, and third regions respectively, and an electromechanical coupling coefficient at the first line occupation rate is larger than the electromechanical coupling coefficients at the second line occupation rate and the third line occupation rate, and the reflection of the surface acoustic wave at the second line occupation rate and the third line occupation rate is larger than the reflection of the surface acoustic wave at the first line occupation rate, and wherein the line occupation rate is defined as a value obtained by dividing a width of the electrode finger by an electrode finger interval that is an interval between centers of the adjacent electrode fingers.

2. The surface acoustic wave resonator according to claim 1, wherein a ratio of an electrode finger interval PTc in the first region to an electrode finger interval $PTs_2$ in the second region is in a range of 1.006 or more to 1.014 or less, and a ratio of the electrode finger interval PTc in the first region to an electrode finger interval $PTs_3$ in the third region is in a range of 1.006 or more to 1.014 or less.

3. The surface acoustic wave resonator according to claim 1, wherein the first line occupation rate is a rate at which the electromechanical coupling coefficient becomes the maximum, and the second line occupation rate and the third line occupation rate are rates at which the reflection of the surface acoustic wave becomes the maximum.

4. The surface acoustic wave resonator according to claim 1, wherein the piezoelectric substrate is a quartz substrate having an Euler angle of (1° to +1°, 113° to 135°, ±(40° to 49°)), wherein a value of the first line occupation rate is in a range of 0.35 or more to 0.5 or less, and values of the second line occupation rate and the third line occupation rate are less than 0.35.

5. The surface acoustic wave resonator according to claim 1, wherein the piezoelectric substrate is a quartz substrate having the Euler angle of (1° to +1°, 121° to 132°, −3° to +3°)), wherein a value of the first line occupation rate is in a range of 0.4 or more to 0.6 or less, and values of the second line occupation rate and the third line occupation rate are more than 0.6.

6. A surface acoustic wave oscillator, comprising:
the surface acoustic wave resonator according to claim 1; and
a circuit element, wherein the surface acoustic wave resonator and the circuit element are mounted in a package.

7. A surface acoustic wave module device, comprising:
the surface acoustic wave resonator according to claim 1 mounted on a circuit substrate.

* * * * *